(12) United States Patent
Yoon et al.

(10) Patent No.: US 12,268,093 B2
(45) Date of Patent: Apr. 1, 2025

(54) METHOD OF PREPARING SHAPE-RECONFIGURABLE MICROPATTERNED POLYMER HAPTIC MATERIAL USING ELECTRIC FIELD TECHNIQUE

(71) Applicant: KOREA ADVANCED INSTITUTE OF SCIENCE AND TECHNOLOGY, Daejeon (KR)

(72) Inventors: Dong Ki Yoon, Daejeon (KR); Ra You, Daejeon (KR); Changjae Lee, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 780 days.

(21) Appl. No.: 17/460,240

(22) Filed: Aug. 29, 2021

(65) Prior Publication Data

US 2022/0069198 A1    Mar. 3, 2022

(30) Foreign Application Priority Data

Sep. 1, 2020    (KR) .................. 10-2020-0110959

(51) Int. Cl.
*H10N 30/078* (2023.01)
*B06B 1/06* (2006.01)
(Continued)

(52) U.S. Cl.
CPC ......... *H10N 30/078* (2023.02); *B06B 1/0696* (2013.01); *H10N 30/06* (2023.02);
(Continued)

(58) Field of Classification Search
CPC .... H10N 30/078; H10N 30/06; H10N 30/079; H10N 30/098; H10N 30/708;
(Continued)

(56) References Cited

U.S. PATENT DOCUMENTS 9,841,631 B2 * 12/2017 Hong ................. G02F 1/133345
2002/0012092 A1 * 1/2002 Son ........................ G02F 1/1416
349/133
(Continued)

FOREIGN PATENT DOCUMENTS

| KR | 1020170032625 A | 3/2017 |
| KR | 102011812 B1 | 8/2019 |
| KR | 1020190107910 A | 9/2019 |

OTHER PUBLICATIONS

Babakhanova, G., et al., "Liquid crystal elastomer coatings with programmed response of surface profile", Nature Communications, 2018, DOI: 10.1038/s41467-018-02895-9, vol. 9, No. 456.
(Continued)

*Primary Examiner* — Emily P Pham
(74) *Attorney, Agent, or Firm* — _HULTQUIST, PLLC; Steven J. Hultquist

(57) ABSTRACT

The present invention relates to a method of preparing a shape-reconfigurable micropatterned polymer haptic material using an electric field technique, and more particularly, to a method of preparing a shape-reconfigurable micropatterned polymer thin film and a haptic material by controlling the orientation of a liquid-crystalline organic polymer using an electric field control system and inducing the generation of defect structures having a regular microstructure array in a polymer film.

15 Claims, 6 Drawing Sheets
(6 of 6 Drawing Sheet(s) Filed in Color)

(51) Int. Cl.
  *H10N 30/00* (2023.01)
  *H10N 30/06* (2023.01)
  *H10N 30/079* (2023.01)
  *H10N 30/098* (2023.01)
  *H10N 30/857* (2023.01)
  *H10N 30/87* (2023.01)

(52) U.S. Cl.
  CPC ......... *H10N 30/079* (2023.02); *H10N 30/098* (2023.02); *H10N 30/708* (2024.05); *H10N 30/857* (2023.02); *H10N 30/87* (2023.02)

(58) Field of Classification Search
  CPC .... H10N 30/857; H10N 30/87; G02F 1/1334; G02F 1/1303; B06B 1/0696; C08J 5/18
  See application file for complete search history.

(56) References Cited

U.S. PATENT DOCUMENTS

2006/0256276 A1* 11/2006 Sha .................. G02F 1/1341
  349/88
2017/0186958 A1* 6/2017 Yoshikawa ........ H10K 85/1135
2020/0056095 A1* 2/2020 Jun .................. C09K 19/02

OTHER PUBLICATIONS

Office Action issued in Korean Patent Application No. 10-2021-0103717 on Jun. 11, 2023.
You, R., et al., "Reconfigurable Periodic Liquid Crystal Defect Array via Modulation of Electric Field", Advanced Materials Technologies, 2019, DOI: 10.1002/admt.201900454, vol. 1900454.
Office Action Cited in counterpart Japanese Patent Application No. 2021-564196 on Jan. 16, 2023.
English Translation of Office Action Cited in counterpart Japanese Patent Application No. 2021-564196 on Jan. 16, 2023.
You, R., "Patterning of microstructures of organic molecules using electric field and its applications", Thesis for Doctor of Philosophy of Chemistry, 2020, Korea Advanced Institute of Science and Technology.
Feng, W., et al., "Combined Light and Electric Response of Topographic Liquid Crystal Network Surfaces", Advanced Functional Materials, 2019, pp. DOI: 10.1002/adfm.201901681, Publisher: WILEY-VCH Verlag GmbH & Co. KGaA, Weinheim.
Liu, D., et al., "Self-assembled Dynamic 3D Fingerprints in Liquid-Crystal Coatings Towards Controllable Friction and Adhesion", Agnew. Chem., 2014, pp. 4630-4634; DOI:10.1002/ange.201400370, vol. 126, Publisher: Wiley Online Library.
Liu, D, et al., "Reverse switching of surface roughness in a self-organized polydomain liquid crystal coating", PNAS Early Edition, 2015, pp. doi/10.1073/pnas.1419312112, Publisher: CrossMark.
Ohzono, T., et al., "Enhanced Dynamic Adhesion in Nematic Liquid Crystal Elastomers", Advanced Materials, 2019, pp. DOI: 10.1002/adma.201902642, Publisher: WILEY-VCH Verlag Gmbh & Co. KGAa, Weinheim.

* cited by examiner

METHOD OF PREPARING SHAPE-RECONFIGURABLE MICROPATTERNED POLYMER HAPTIC MATERIAL USING ELECTRIC FIELD TECHNIQUE

CROSS-REFERENCE TO RELATED APPLICATION

The priority of Korean Patent Application 10-2020-0110959 filed Sep. 1, 2020 is hereby claimed under 35 USC § 119. The disclosure of Korean Patent Application 10-2020-0110959 is hereby incorporated herein by reference, in its entirety, for all purposes.

TECHNICAL FIELD

The present invention relates to a method of preparing a shape-reconfigurable micropatterned polymer haptic material using an electric field technique, and more particularly, to a method of preparing a shape-reconfigurable micropatterned polymer thin film and a haptic material by controlling the orientation of a liquid-crystalline organic monomer using an electric field control system and inducing the generation of defect structures having a regular microstructure array in a polymer film.

BACKGROUND ART

In recent years, haptic interface technology has gradually increased in importance as a factor to give a sense of reality to users in a VR environment or a differentiating factor leading to the luxurious feeling of a product such as a trend-leading mobile phone. This technology may be realized by enabling pressure stimulation of various strengths to be applied to a desired position or enabling surface roughness to be changed, and furthermore, technology that can actively realize this application of pressure stimulation and change of surface roughness according to the situation is required.

In this regard, many studies have recently been conducted on the development of structures made of polymer materials based on liquid crystal polymer networks. Liquid crystalline monomers are anisotropic materials whose molecular orientation can be controlled in a desired direction through various methods (such as surface energy, electric and magnetic fields, and confinement effects). When an acrylic functional group is introduced into a liquid crystalline monomer, the aligned structures may be immobilized through cross-linking to form aligned polymer structures. The formed polymer structures are called liquid crystal polymer networks, and the liquid crystal polymer networks can be deformed by external stimuli (heat, light, humidity, etc.). The alignment of anisotropic structures changes to the alignment of isotropic structures, and stress strain in the film occur, which induces strain deformation such as surface depression or elevation. The human haptic system is sensitive even to nano-scale surface changes, and can sense changes in the haptic interface even when the surface topography of a polymer thin film changes. Therefore, an anisotropic liquid crystal polymer network polymer material composed of spatially precisely arranged liquid crystal molecules is a suitable material for realizing a haptic interface.

A number of previous studies have reported that aligned structures are fabricated mainly using photo-alignment and surface treatment alignment methods to form liquid crystal polymer networks. A conventional mechanical rubbing method or photo-alignment method is a method in which liquid crystal monomer molecules simply lie down or stand at a desired place. As this alignment method, a method is mainly used in which the initial alignment of a liquid crystal monomer is set in advance on a substrate and then a mixture is injected and crosslinked to fabricate a polymer structure. In general, in this method, only 2D in-plane alignment is possible. Thus, it is not easy to change the preset alignment, and the out-of-plane alignment in the z-axis direction is very difficult.

Korean Patent No. 10-2011812 discloses a mechanical property-variable, stimulus-responsive liquid crystal polymer-cellulose nanocrystal multilayer composite material, and has problems in that it is complicated due to the use of the two materials and, in particular, does not comprise a method of controlling the frictional force using a liquid crystal polymer.

Korean Patent Publication No. 10-2017-0032625 relates to a texture presentation device for forming wrinkles through Maxwellian stress generated between electrodes having a sandwich structure, but has a problem in that it cannot present complex and various textures other than simple wrinkles.

T. Ohzono et al. Adv. Mater. 2019, 31 (30), 1902642 describes a study on temperature-dependent changes in the adhesive and frictional forces of liquid crystal polymer-based materials. This study has a problem in that it does not deal with the changes in frictional force depending on surface structure changes caused by external stimuli.

D. Liu et al., Angew. Chem. 2014, 1236, 4630-4634, D. Liu et al. Proc. Nat. Acad. Sci. 2015, 112(13), 3880-3885, and W. FENG et al. Adv. Func. Mater. 2019, 1901681 show studies on controlling frictional force through micro-surface changes of liquid crystal polymer-based materials, and these studies have problems in that the surface changes are irregular and do not propose a method of finely controlling the frictional force by controlling the intensity of an external stimulus.

Accordingly, the present inventors have made extensive efforts to realize liquid crystal polymer networks that overcome the above-described problems, and as a result, have found that, when an electric field control system is used, various structures that have not been established before can be produced in real time by controlling the orientation of a liquid crystal organic polymer using an electric field control system and inducing the generation of defect structures having a regular microstructure array in a polymer film, and a micropatterned polymer thin film whose surface topology freely changes can be produced in a simple manner without fusion with other materials, and also it is possible to produce a haptic material whose frictional force is precisely controlled due to fine deformations caused by the change in surface roughness resulting from a temperature change among external stimuli, thereby completing the present invention.

PRIOR ART DOCUMENTS

Patent Documents

Korean Patent No. 10-2011812
Korean Patent Publication No. 10-2017-0032625

Non-Patent Documents

T. Ohzono et al. Adv. Mater. 2019, 31(30), 1902642
D. Liu et al., Angew. Chem. 2014, 1236, 4630-4634
D. Liu et al. Proc. Nat. Acad. Sci. 2015 112(13), 3880-3885
W. FENG et al. Adv. Func. Mater. 2019, 1901681

SUMMARY OF THE INVENTION

An object of the present invention is to provide a method of preparing a shape-reconfigurable micropatterned polymer thin film by controlling the orientation of a liquid-crystalline organic polymer using an electric field control system and inducing the generation of defect structures having a regular microstructure array in a polymer film.

Another object of the present invention is to provide a shape-reconfigurable micropatterned polymer thin film produced by the method and a haptic material comprising the same.

To achieve the above objects, the present invention provides a method of preparing a shape-variable micropatterned polymer thin film, the method comprising: (a) forming a polymer alignment layer on each of two patterned electrode substrates; (b) fabricating a sandwich electrode cell by cross-assembling the two patterned electrode substrates on which the polymer alignment layer is formed at regular intervals; (c) injecting a liquid-crystalline organic monomer mixture between the two substrates of the sandwich electrode cell; and (d) producing a micropatterned polymer thin film by performing photocuring of the mixture in a state in which an electric field is applied to the sandwich electrode cells containing the liquid-crystalline organic monomer mixture therein.

The present invention also provides a shape-reconfigurable micropatterned polymer thin film in which −1 topological defects are formed in crossed electrodes, +1 topological defects are formed between vertical electrode and horizontal electrode, −1 topological defects are formed at the diagonal centers of the electrodes, and surface depression deformations around the topological defects increase to 5 to 800 nm with increasing external temperature, so that a change in the roughness or frictional force of the surface of the polymer thin film is induced.

The present invention also provides a shape-reconfigurable micropatterned polymer haptic material in which −1 topological defects are formed in crossed electrodes, +1 topological defects are formed between vertical electrode and horizontal electrode, −1 topological defects are formed at the diagonal centers of the electrodes, and surface depression deformations around the topological defects increase to 5 to 800 nm with increasing external temperature, so that a change in the roughness or frictional force of the surface of the polymer thin film is induced, wherein liquid-crystalline organic polymer is composed of polymer of 4-(3-acryloyloxypropyloxy)-benzoic acid 2-methyl-1,4-phenylene ester and 4-methoxybenzoic acid 4-(6-acryloyloxy-hexyloxy) phenyl ester.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other objects, features and other advantages of the present invention will be more clearly understood from the following detailed description taken in conjunction with the accompanying drawings, in which.

BEST MODE FOR CARRYING OUT THE INVENTION

Figure 1:
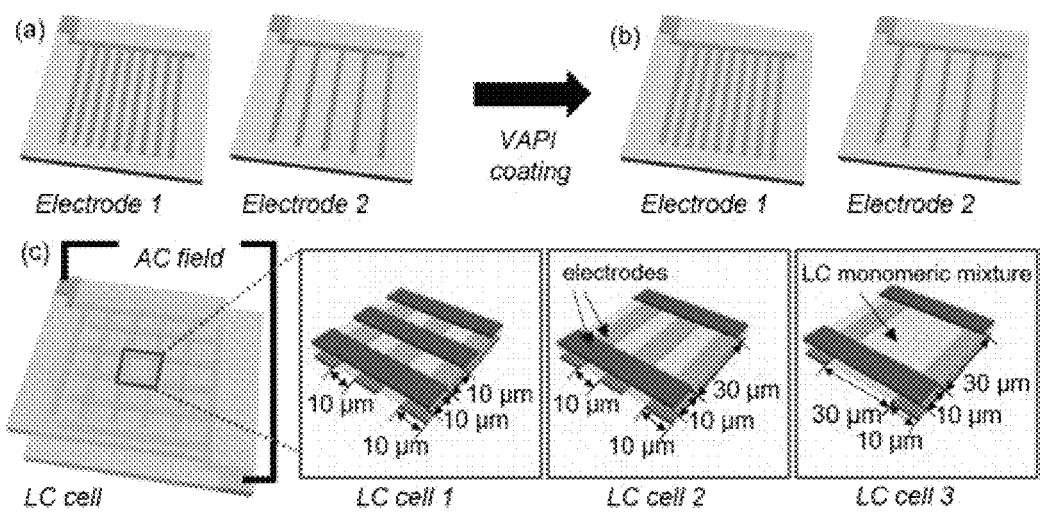
FIG. 1 is a schematic view illustrating a process of producing a polymer thin film using an electric field control technique according to one embodiment of the present invention.

Unless otherwise defined, all technical and scientific terms used in the present specification have the same meanings as commonly understood by those skilled in the art to which the present disclosure pertains. In general, the nomenclature used in the present specification is well known and commonly used in the art.

In the present invention, a patterned electric field was formed by vertically combining two striped electrodes to cross each other in various ways, various liquid-crystalline microstructures were fabricated using an acrylic liquid-crystalline monomer mixture whose orientation may be controlled by an electric field, and a micropatterned liquid-crystalline polymer thin film was fabricated by performing photocuring of the mixture through UV light irradiation. It has been found that, since the topology of the fabricated polymer thin film can actively change in response to an external stimulus so that the surface roughness and frictional force of the polymer thin film change, the polymer thin film may be applied as a haptic material, which induces a change in the tactile sense felt by a person, or a change detection sensor.

Therefore, in one aspect, the present invention is directed to a method of preparing a shape-reconfigurable micropatterned polymer thin film, the method comprising: (a) forming a polymer alignment layer on each of two patterned electrode substrates; (b) fabricating a sandwich electrode cell by cross-assembling the two patterned electrode substrates on which the polymer alignment layer is formed at regular intervals; (c) injecting a liquid-crystalline organic monomer mixture between the two substrates of the sandwich electrode cell; and (d) producing a micropatterned polymer thin film by performing photocuring of the mixture in a state in which an electric field is applied to the sandwich electrode cells containing the liquid-crystalline organic monomer mixture therein.

Hereinafter, the present invention will be described in detail.

In the present invention, regular polymer micropatterns are formed using an electric field, and the nano-scale active micro-deformations caused by topographic change on the surface of the formed polymer thin film may be observed. Accordingly, the present invention is directed to a method capable of fabricating various microstructures by a simple control method comprising controlling the lattice structures of electrodes and applying an electric field.

An alignment method using an electric field has been used for a long time in liquid crystal displays. If the alignment of liquid crystal monomers can be variously controlled and the direction of the electric field can be controlled more complexly, molecular alignment can also be recombined accordingly, and it is possible to form a 3D polymer structure capable of angular deformation. In the past, a surface alignment method capable of only two-dimensional micropatterning was used, but in the present invention, the patterning area may be expanded by fabricating three-dimensional microstructures using a three-dimensional electric field.

In the present invention, the patterned electrode substrate in step (a) may be an electrode substrate having a stripe pattern, and the width of each stripe in the stripe pattern is 5 to 20 μm, preferably 10 to 15 μm, and the spacing between the stripes may be 5 to 40 μm, preferably 10 to 20 μm. If the width of each stripe and the spacing between the stripes are out of the above ranges, a problem arises in that the orientation of the liquid crystal polymer is not effectively changed by the applied electric field.

In step (b) of the present invention, the patterned electrode substrates having the polymer alignment layer coated thereon may be electrode substrates having stripe patterns at different spacings.

In the present invention, the thickness of the sandwich electrode cell may be 2 to 20 μm, preferably 5 to 10 μm. When the thickness of the electrode cell is out of the above range, a problem arises in that the cell is damaged by the electric field or the orientation of the liquid crystal polymer is not effectively changed by the electric field.

In the present invention, the liquid-crystalline organic monomer mixture may contain a liquid-crystalline organic monomer having at least one acrylic group attached thereto and a photoinitiator. Here, the liquid-crystalline organic monomer may be at least one selected from the group consisting of 4-(3-acryloyloxypropyloxy)-benzoic acid 2-methyl-1,4-phenylene ester, 4-methoxybenzoic acid 4-(6-acryloyloxy-hexyloxy)phenyl ester, 4-cyanophenyl-4'-(6-acryloyloxyhexyloxy)benzoate, and 1,4-bis-[4-(6-acryloyloxyhexyloxy)benzoyloxy]-2-methylbenzene, and the photoinitiator may be at least one selected from the group consisting of 2,2-dimethoxy-2-phenylacetophenone, bis(2,4,6-trimethylbenzoyl)-phenylphosphine oxide, bis(η-5-2,4-cylcopentadien-1-yl)-bis(2,6-difluoro-3-(1H-pyrrol-1-yl)-phenyl)titanium, and 2-benzyl-2-dimethylamino-1-(4-morpholinophenyl)-butanone-1, but the present invention is not limited thereto.

In the present invention, step (d) may comprise irradiating UV light at an intensity of 10 to 200 mW for 1 minute to 2 hours, preferably at an intensity of 15 to 100 mW for 15 minutes to 1 hour, but the present invention is not limited thereto. If the irradiation intensity and irradiation time of UV light are out of the above ranges, a problem arises in that complete polymerization of the monomers is not achieved, resulting in defects.

In the present invention, the polymer alignment layer in step (a) may be formed by coating the patterned electrode substrate with a solution of molecular-phobic polyimide, followed by curing, wherein the curing may be performed by soft baking at a temperature of 60 to 120° C. and hard baking at a temperature of 150 to 200° C.

In the present invention, the liquid-crystalline organic monomer mixture may be injected between the two substrates of the electrode cell at an isotropic phase temperature and then cooled, and an electric field, preferably an alternating electric field, may be applied thereto at the temperature of the nematic liquid crystal phase. The electric field may be applied at an electric field frequency of 80 kHz to 2 MHz and a voltage of 2 to 200 V.

In the present invention, a liquid-crystalline micropatterned polymer thin film having micropatterns formed therein was fabricated using an electric field, and it was found that a haptic material whose surface topography changes in response to a temperature among external stimuli to have fine topographical deformations may be produced using the polymer thin film. It could be confirmed that, as the temperature gradually increased, surface depression deformations around the topographical defects gradually increased to a level of several hundred nm, which could change the surface roughness and change the human haptic system that senses a surface change of several nm. This is supported by the experimental results indicating that the force of friction between the polymer thin film of the present invention and a flat sheet of glass gradually decreases with increasing temperature. Accordingly, it was confirmed that the shape-reconfigurable micropatterned polymer thin film according to the present invention may be used as a haptic material or a sensor material.

Therefore, another aspect of the present invention is directed to a shape-reconfigurable micropatterned polymer thin film in which −1 topological defects are formed in crossed electrodes, +1 topological defects are formed between vertical electrode and horizontal electrode, −1 topological defects are formed at the diagonal centers of the electrodes, and surface depression deformations around the topological defects increase to 5 to 800 nm with increasing external temperature, so that a change in the roughness or frictional force of the surface of the polymer thin film is induced.

Still another aspect of the present invention is directed to a shape-reconfigurable micropatterned polymer haptic material in which −1 topological defects are formed in crossed electrodes, +1 topological defects are formed between vertical electrode and horizontal electrode, −1 topological defects are formed at the diagonal centers of the electrodes, and surface depression deformations around the topological defects increase to 5 to 800 nm with increasing external temperature, so that a change in the roughness or frictional force of the surface of the polymer thin film is induced, wherein liquid-crystalline organic polymer is composed of polymer of 4-(3-acryloyloxypropyloxy)-benzoic acid 2-methyl-1,4-phenylene ester and 4-methoxybenzoic acid 4-(6-acryloyloxy-hexyloxy)phenyl ester.

As used herein, the term "+1 topological defects" refers to discontinuous points at the centers of structures in which liquid crystal molecules are uniformly arranged in a radially extending form when viewed in two dimensions. In addition, the term "−1 topological defects" refers to discontinuous points at the centers of structures in which four structures including liquid crystal molecules arranged in a parabolic shape are gathered with the curved surface of each parabola facing the center, when viewed in two dimensions.

According to a preferred embodiment of the present invention, a platform for producing a polymer thin film by controlling an electric field is realized by fabricating a sandwich cell by vertically combining patterned electrodes so as to cross each other. The two striped electrodes were treated with a vertical alignment polymer to increase the uniformity of molecular structures. Thereafter, the electrode substrates were combined to cross each other, thus fabricating a total of three sandwich cells, each having a thickness of about 4.8±0.3 μm.

FIG. 1 schematically shows a process of producing a micropatterned polymer thin film using an electric field technique. Two striped electrodes are used (FIG. 1, in (a) therein), and subjected to vertical alignment treatment to increase the regularity of structural control (FIG. 1, in (b) therein). A sandwich cell is fabricated by vertically combining two striped electrodes to cross each other, and the mixture is injected therein, and then a system to which an electric field is applied is fabricated (FIG. 1, in (c) therein).

To realize the present invention, production of the liquid crystal polymer network is performed using a mixture composed of 4-(3-acryloyloxypropyloxy)-benzoic acid 2-methyl-1,4-phenylene ester (69 wt %) having two acrylic groups attached thereto, 4-methoxybenzoic acid 4-(6-acryloyloxy-hexyloxy)phenyl ester (30 wt %) having one acrylic group attached thereto, and 2,2-dimethoxy-2-phenyl-acetophenone (1 wt %) as a photoinitiator, and the above mixture has an isotropic phase and a nematic phase in turn during a cooling process. The temperature of transition from the isotropic phase to the nematic phase is about 87° C. The above mixture in the isotropic state is injected into the sandwich cell through capillary force. Then, in the nematic state, the mixture forms the most regular liquid crystal micro-defect structures in the upper and lower electrodes while the strength of the alternating electric field is increased. Due to the mixture that is aligned perpendicular to the electric field due to the structure of the molecular sieve, as the strength of the electric field increases, the molecular orientation gradually lies in the vertical orientation, and regular microstructures are formed. After regular liquid-crystal microstructures are formed, a polymerization reaction using photocuring by UV light irradiation is started. Thereafter, micropatterned liquid crystal polymer network films can be obtained.

Figure 2:
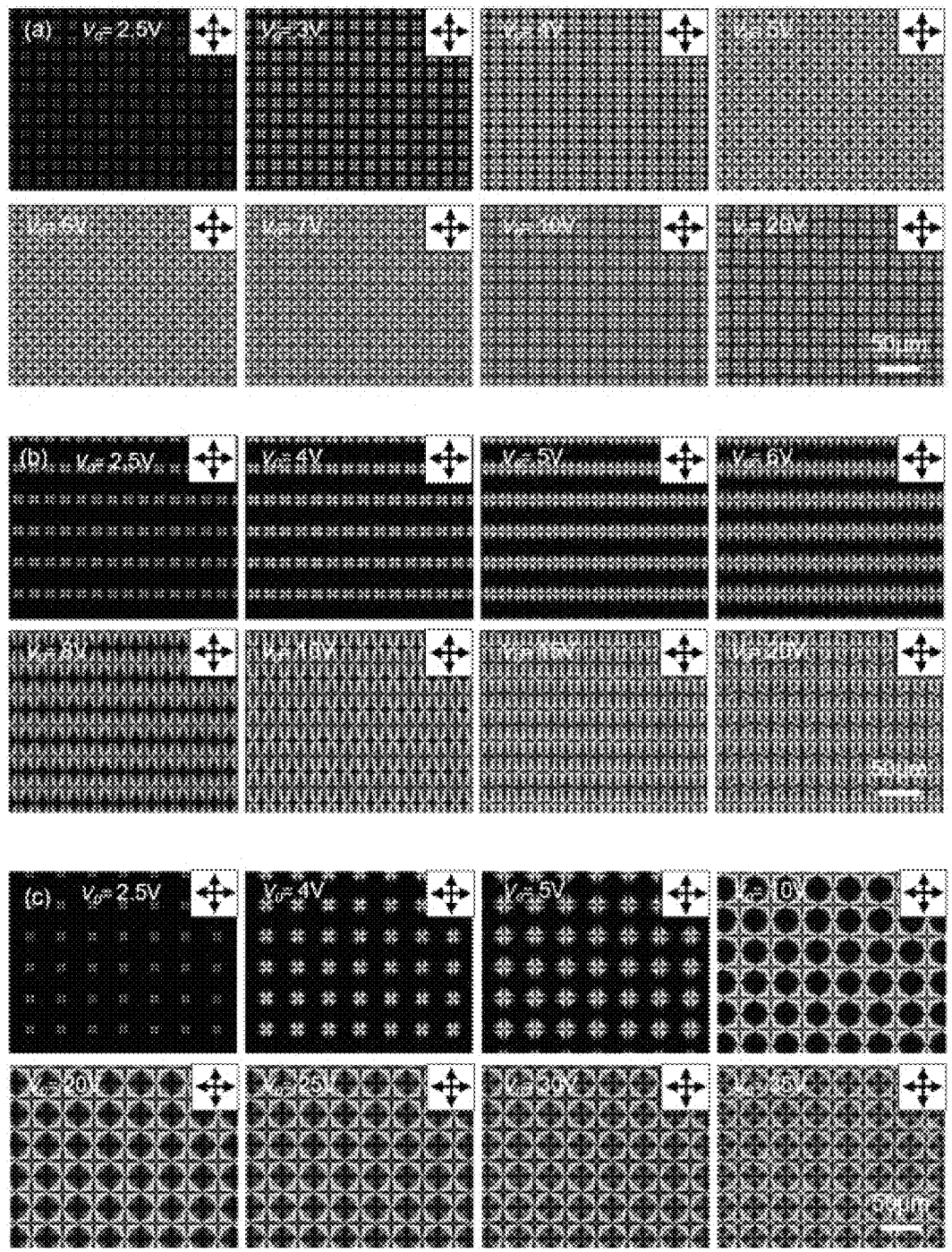
FIG. 2 illustrates a process of forming regular micro liquid crystal defect structures depending on the applied intensity of an electric field according to one embodiment of the present invention.

FIG. 2 illustrates a process of forming regular liquid-crystal defect microstructure by applying electric fields with various intensities. FIG. 2 shows the optical textures obtained in a state in which regular liquid-crystal alignment microstructures are formed in vertical alignment as the intensity of the electric field in each of three different sandwich electrode cells increases. Each structure was observed at an electric field frequency of 100 kHz and a temperature of 75° C.

It can be confirmed through microscopic images that the liquid crystal polymer network polymer patterning and production according to the present invention was successfully implemented. A polymer film could be produced for the first time by applying an electric field through an array of three different patterned electrodes, adding the liquid crystal monomer mixture, and aligning the liquid crystal monomer molecules according to the orientation of the electric field, followed by polymerization. The immobilized molecular alignment structure can be seen in FIG. 3.

Figure 3:
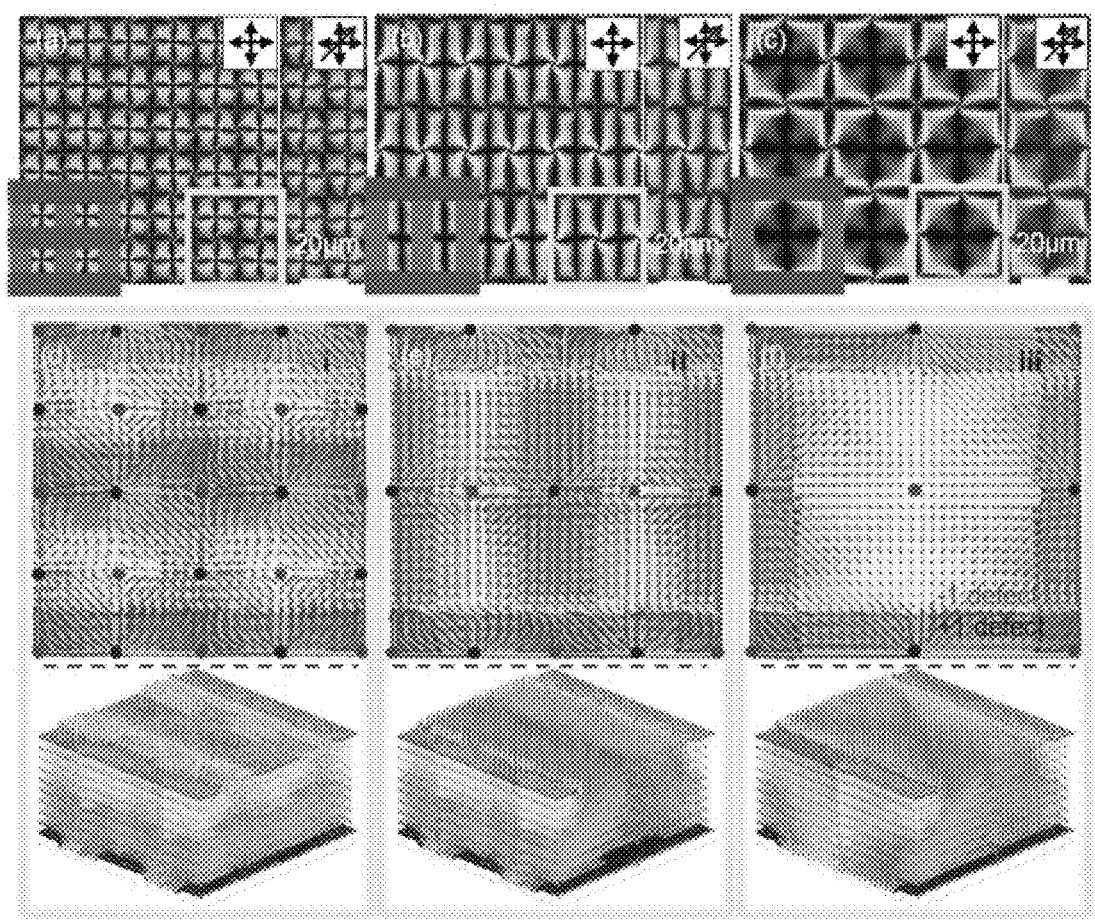
FIG. 3 shows polarization microscope images observed after forming a regularly patterned polymer thin film in each of three sandwich cells according to one embodiment of the present invention.

FIG. 3 shows polarization microscope images of regularly formed micropatterned polymer thin films and depicts schematic views showing the results of simulating liquid molecules corresponding to defect structures.

To confirm this, the substrate was removed from one side of each of the polymer thin films and the change in surface topography with temperature among external stimuli was observed. The three differently patterned liquid crystal polymer network polymer thin films showed only a striped electrode pattern at 50° C. Then, when each of the films was heated above the glass transition temperature thereof (about 87° C.), periodic surface deformations were formed in the liquid crystal polymer network thin films having periodic defects. At this time, the topographical deformations appeared as depression deformations in all topological defects, and the deformation behavior became larger as the temperature increased.

These results are important results indicating that the film may be used as a haptic material according to the present invention, and are basic results indicating that the film is an active polymer material that actively changes its surface topography in response to external stimuli.

Figure 4:
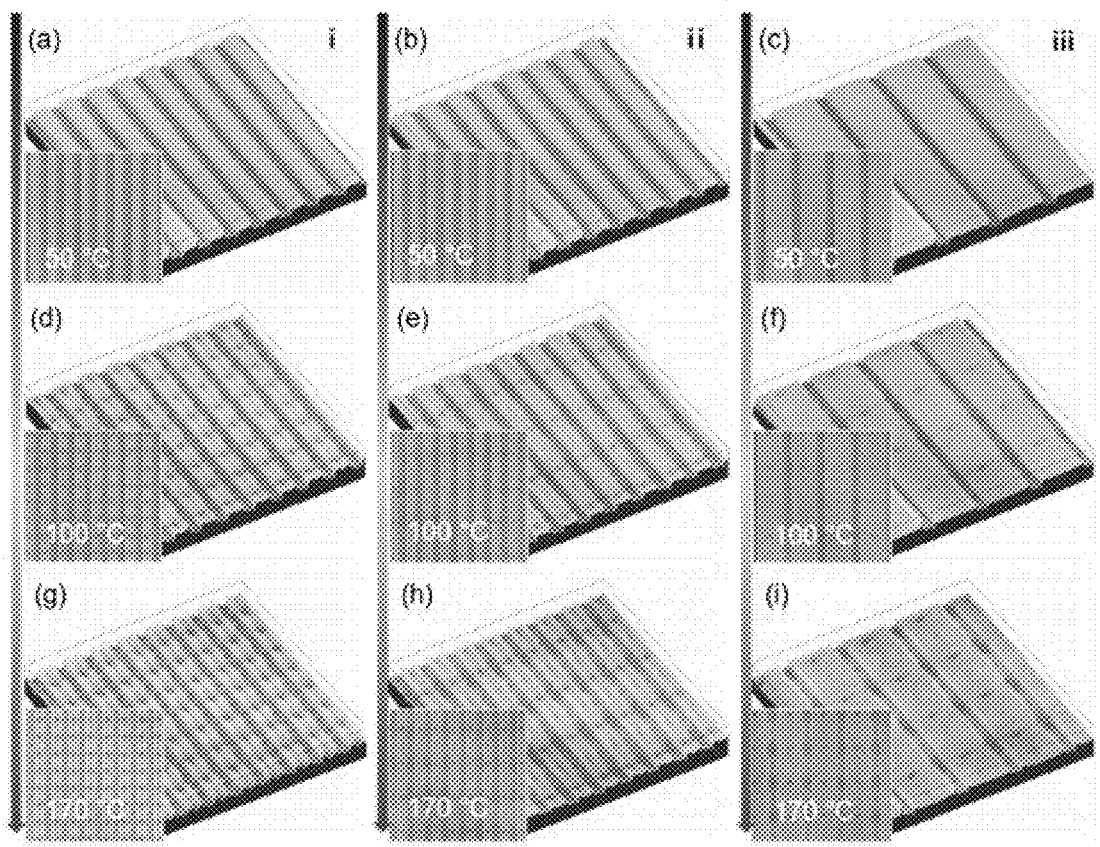
FIG. 4 depicts images showing temperature-dependent changes in the 3D surface topography of micro-patterned polymer coating thin films produced according to one embodiment of the present invention.
Figure 5:
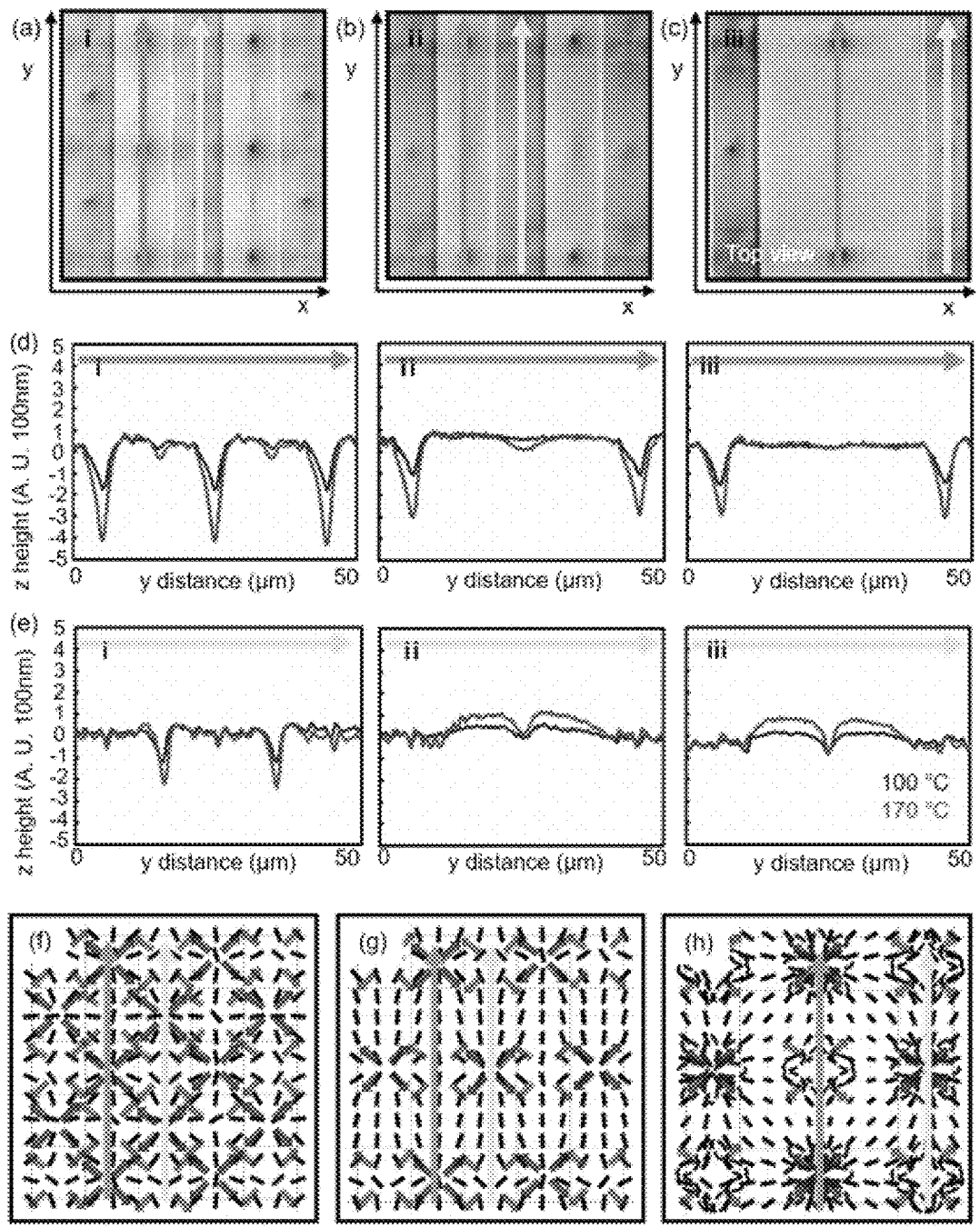
FIG. 5 depicts graphs showing surface roughness depending on the temperatures indicated in FIG. 1 according to one embodiment of the present disclosure.

FIG. 4 depicts images showing temperature-dependent changes in the surface topography of micropatterned polymer thin films, and in order to confirm the results of topographical deformation in more detail, temperature-dependent changes in surface roughness were graphically expressed (FIG. 5).

For each pattern, surface topography images were acquired at temperatures of 50° C., 100° C., and 170° C., and surface depressions were observed in all defects. This means that surface topographic change is actively induced by thermal stimulation.

It can be confirmed once again that depression deformations were observed in all topological defects, and it can also be confirmed that the degree of surface deformation increased with increasing temperature. These results can prove that the liquid crystal polymer network thin film patterned by an electric field can respond to an external stimulus and that a change in the surface thereof can be finely controlled.

Figure 6:
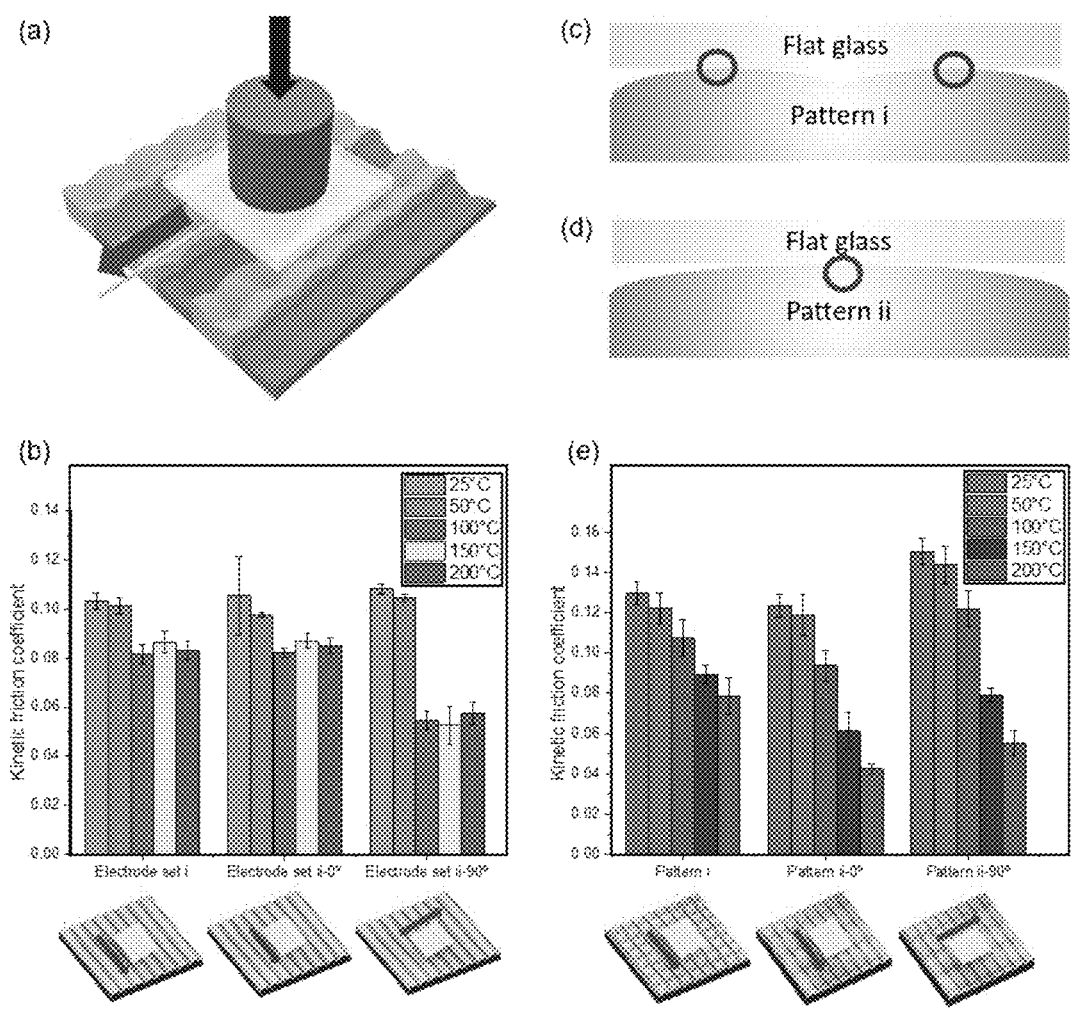
FIG. 6 depicts an experimental design drawing for observing temperature-dependent frictional force, and depicts graphs showing the results of measuring the frictional force.

FIG. 6 shows experimental results indicating that the coefficient of friction between the patterned liquid crystal polymer network polymer thin film and flat glass gradually decreases as the depression on the patterned liquid crystal polymer network polymer thin film intensifies. The coefficient of friction between a polymer thin film having only electrode patterns and no micropatterns as a control and flat glass decreases rapidly after a certain temperature and is maintained at a similar value at a higher temperature. These results suggest that the gradual decrease in the frictional force of the patterned liquid crystal polymer film is distinctive, indicating that fine control of frictional force is possible.

In summary, a patterned liquid crystal polymer thin film can be produced using an electric field technique, and surface deformations in a pre-patterned polymer thin film can be induced through an external stimulus. Here, the surface change is an important principle that can induce haptic changes while changing the frictional force of the surface by changing the roughness of the surface.

Therefore, it is possible to develop a patterned liquid crystal polymer thin film using an electric field, and it is possible to develop a haptic material whose surface topography changes in response to an external stimulus.

Hereinafter, preferred examples will be presented to aid in understanding the present invention, but it will be apparent to those skilled in the art that the following examples are merely illustrative of the present invention, and various variations and modifications are possible without departing from the scope and spirit of the present invention. It should be understood that such variations and modifications fall within the scope of the appended claims.

EXAMPLES

Example 1: Fabrication of Shape-Reconfigurable Micropatterned Polymer Thin Film 1. Fabrication of Patterned Electrode Substrate Patterned electrode substrates were made for an electric field-based liquid crystal alignment platform. An ITO pattern was formed on each glass substrate using a lift-off process. The first ITO glass substrate had a stripe pattern with a stripe width of 10 μm and a stripe spacing of 10 μm, and the second ITO glass substrate had a stripe pattern with a stripe width of 10 μm and a stripe spacing of 30 μm.

2. Coating with VAPI Polymer Alignment Layer

The glass substrates having the ITO electrode pattern formed thereon were washed sequentially with acetone (SAMCHUN Chemical), ethanol (ethyl alcohol, SAMCHUN Chemical), and triple distilled water (18.3 MΩ/cm, Human Corp.). In order to induce vertical alignment of liquid crystal monomer molecules, a solution of molecular-phobic polyimide among imide-based polymers was spin-coated on each of the substrates, and cured by soft baking and hard baking at 90° C. and 200° C., respectively, to obtain molecular-phobic polyimide films.

3. Fabrication of Sandwich Cell

To fabricate an electrode cell to which an electric field is applied at regular intervals, two substrates were used, and 5-μm beads were placed between the two substrates which were then combined. The two substrates were mixed with the beads using UV curing glue, and then bonded to each other through photocuring. In particular, an electrode structure with a periodic grid was fabricated by bonding two patterned substrates so as to cross each other at an angle of 90°. Three electrode cells were fabricated using a total of two types of patterned electrode substrates.

4. Preparation and Injection of Liquid Crystal Polymer Network Mixture Material

The mixture used in this Example was composed of 4-(3-acryloyloxypropyloxy)-benzoic acid 2-methyl-1,4-phenylene ester (69 wt %) having two acrylic groups attached thereto, 4-methoxybenzoic acid 4-(6-acryloyloxyhexyloxy)phenyl ester (30 wt %) having one acrylic group attached thereto, and 2,2-dimethoxy-2-phenyl-acetophenone (1 wt %) as a photoinitiator, and the above mixture had an isotropic phase and a nematic phase in turn during a cooling process. The temperature of transition from the isotropic phase to the nematic phase was about 87° C. The above mixture in the isotropic state was injected into the sandwich cell through capillary force. Thereafter, the temperature was lowered to 75° C., at which the mixture became the nematic phase and was then maintained.

5. Fabrication of Microstructures Through Application of Electric Field and Fabrication of Polymer Thin Film Through Photocuring An electric field was gradually applied in a top-down manner using an alternating electric field. The most regular microstructures were formed at f=100 kHz and V0=10V for pattern 1, f=100 kHz and V0=15V for pattern 2, and f=100 kHz and V0=30V for pattern 3. Thereafter, photocuring was performed through UV irradiation while the electric field and temperature were maintained. The resulting structures were irradiated with UV light at an intensity of 50 to 100 mW for 20 minutes or more, thus fabricating polymer thin films.

Example 2: Observation of Optical Texture

The optical texture appearing in the nematic liquid crystal phase upon application of an electric field was observed through a polarization microscope (LV 100-POL, Nikon) while cooling from the isotropic temperature using a heating stage (LINKAM). In addition, after the polymer thin films were fabricated, one-side glass substrate was removed therefrom, and the optical textures of the thin films were observed at room temperature, and the results are shown in FIGS. 2 and 3.

In FIG. 3, in (a) therein, structures in which −1 and +1 topological defects alternately exist every 20 μm on the x-axis and y-axis are shown. In FIG. 3, in (b) therein, structures in which topological defects alternately exist every 20 μm on the x-axis and 40 μm on the y-axis are shown. FIG. 3, in (c) therein, shows a structure in which topological defect arrays exist every 40 μm on the x-axis and the y-axis. FIG. 3, in (d) to (f) therein, shows top-down views and perspective views of the results of simulating the molecular orientation corresponding to each of the patterns shown in FIG. 3, in (a) to (c) therein.

−1 topological defects are formed in the portions where the electrodes cross each other, and then +1 topological defects are vertically and horizontally formed therebetween, and −1 topological defects are formed in the centers of the diagonal lines. For pattern 1 in FIG. 3, in (a) therein, topological defects are formed at intervals of 20 μm in the vertical and horizontal directions, and for pattern 2 in FIG. 3, in (b) therein, topological defects are formed at intervals of 40 μm in the vertical direction and 20 μm in the horizontal direction, and for pattern 3 in FIG. 3, in (c) therein, topological defects are formed at intervals of 40 μm in the vertical and horizontal directions. At this time, in the case of the +1 topological defects, anisotropic polymer orientation appears in the form of splay deformation, and in the case of the −1 topological defects, anisotropic polymer orientation appears in the form of four bend deformations. Such anisotropic polymer orientation may act to cause a mechanism that induces deformation of liquid crystal polymer networks when an external stimulus change is applied to the isotropic orientation.

Example 3: Observation of Surface Topography Image and Surface Roughness Graph Polymer thin film-coated substrates from which one-side glass substrate was removed were used, and the surface topography thereof was changed by heating from room temperature and cooling using a heating stage (LINKAM). The resulting surface topography images and surface roughness graphs were observed through a surface profiler (msurf), and the results are shown in FIGS. 4 and 5.

FIG. 4 depicts images showing temperature-dependent changes in the surface topography of the micropatterned polymer thin films. In order to confirm the results of topographical deformation in more detail, temperature-dependent changes in surface roughness were graphically expressed.

For each pattern, surface topography images were acquired at temperatures of 50° C., 100° C., and 170° C., and surface depressions were observed in all defects. This means that the surface topographic change is actively induced by thermal stimulation.

FIG. 5 depicts graphs showing the surface roughness corresponding to the surface topographic changes indicated by the green arrow in FIG. 4. The upper images in FIG. 5, in (a) to (c) therein, are top-down views of surface topologies at 170° C. FIG. 5, in (d) therein, is a graph showing the surface roughness corresponding to the green arrows at 100° C. and 170° C. indicated in the upper images, and FIG. 5, in (e) therein, is a graph showing the surface roughness corresponding to the yellow arrows at 100° C. and 170° C. indicated in the upper images. It is shown that the surface depression deformation gradually deepens depending on temperature, suggesting that the surface change is actively increased gradually by external stimuli. FIG. 5, in (f) to (h) therein, shows the anisotropic polymer structures and the activation force distribution around the defects with increasing temperature.

It can be confirmed once again that depression deformation was observed in all topological defects, and it can also be confirmed that the degree of surface deformation increased as the temperature increased. In particular, for the +1 topological defects, when the temperature was changed from 100° C. to 170° C. in the green surface roughness graph, depression deformations of 226 nm→498 nm in pattern 1, 180 nm→386 nm in pattern 2, and 185 nm→326 nm in pattern 3 were observed. These results are because of the use of sample thicknesses of approximately 5.11 μm, 4.76 μm and 4.61 μm. For the −1 topological defects, depression deformations of 36 nm→112 nm in pattern 1, 0 nm→74 nm in pattern 2, and 0 nm→about 10 nm in pattern 3 were observed. The above results indicate that deformation is much stronger in the +1 topological defects than in the −1 topological defects. The reason is that, due to the bend structures around the −1 defects, the deformation tends to be suppressed in the −1 defect region, the distortion is more dispersed than the +1 defects around the defect center, and a surface deformation of <100 nm occurs weakly. The yellow surface roughness graph shows the same trend as the green surface roughness graph. The depression deformation of the +1 topological defect structure is greater than that of the −1 defect structure. Meanwhile, the deformation in the yellow surface roughness graph lower than that in the green surface roughness graph is observed. The reasons are as follows. First, the degree of deformation is reduced due to the reduced thickness of the removed electrode. Second, it can be considered that, since surface anchoring is stronger and the effect of thinning the thickness in the ITO-present portion of the underlying substrate is stronger than that of bare glass, the depression deformation occurs more deeply in the green surface roughness graph. In summary, the orientation of the polymer morphology inside the patterned liquid crystal polymer network thin film can be mapped to analyze the deformation. When the liquid crystal structure changes from an anisotropic structure to an isotropic structure, the force indicated by the arrow in FIG. 5, in (f) to (h) therein, is generated. A previously published paper shows that, when a polymer thin film has bend deformations in the form of splay deformation, a divergent force is induced around the +1 topological center to induce depression deformation.

In addition, in the −1 hyperbolic topological defect, bend deformation is dispersed and four peaks and valleys are formed, but depression deformation may occur at the center. Therefore, depression deformation can be induced in all topological centers. These results prove that the liquid crystal polymer network polymer thin film patterned by an electric field can respond to an external stimulus and the surface change thereof can be finely controlled.

Example 4: Observation of Frictional Coefficient that Decreases as Deformation Intensifies FIG. 6, in (a) therein, is an experimental design drawing for observing the temperature-dependent coefficient of friction of the liquid crystal polymer network thin film. FIG. 6, in (b) therein, is a graph showing the results of observing the temperature-dependent coefficient of friction between a polymer thin film, as control, which has only an electrode pattern surface structure without a micropattern while all liquid crystal units thereof maintain a vertical arrangement, and flat glass. In this case, the viscoelasticity of the polymer thin film rapidly decreased from a temperature above the glass transition temperature, and the coefficient of friction also greatly decreased, and then was maintained at a similar value at a higher temperature. FIG. 6, in (c) and (d) therein, shows views depicting, in unit area, an aspect in which polymer thin films having pattern 1 and pattern 2, respectively, come into contact with glass when deformed at a high temperature. Here, it can be seen that, in the case of pattern 1, the number of portions coming into contact with glass per unit area is two times larger than that in the case of pattern 2. FIG. 6, in (e) therein, is a graph showing the results of observing the temperature-dependent coefficient of friction between the polymer thin film having pattern 1 or 2 and the flat glass. In contrast to FIG. 6, in (b) therein, it can be seen that the friction coefficient gradually decreases with increasing temperature. This is a result of the phenomenon in which the area of contact with the flat glass gradually decreases as the depression in the polymer thin film deepens. As shown in FIG. 6, in (c) and (d) therein, it can be seen that, when the strength of deformation at 200° C. is maximum, the coefficient of friction of pattern 1 is about twice that of pattern 2.

The above results show that the micropatterned liquid crystal polymer network thin film of the present invention can be applied as an active haptic material, because the frictional force thereof can be finely controlled through gradual surface changes.

INDUSTRIAL APPLICABILITY

The method of preparing a micropatterned liquid crystal polymer thin film according to the present invention has advantages in that it can fabricate various microstructures through the control of an electric field, and also expand the structures by changing the crossing of electrodes.

The technology of the present invention can fabricate a micropatterned polymer thin film by forming microlattice electrode patterns and applying an electric field, and the topography of the polymer thin film can actively change in response to an external stimulus. In particular, the polymer thin film fabricated in the present invention may be used as a material that can be bonded to a wide variety of substrate surfaces, because it is independently separable and transferable to an external substrate. In addition, the surface roughness and frictional force of the polymer thin film change as the surface topography thereof actively changes in response to an external stimulus, and the polymer thin film can be applied as a haptic material, which induces a change in the tactile sense felt by a person, or a change detection sensor.

In addition, the patterned polymer thin film material which is topographically changed by external stimuli is an important thin film material that can be used as a haptic material, and the applicability thereof can be further expanded as a material that can be independently detached and attached to various substrates.

The present invention is a method that can easily and quickly fabricate various microstructures in a large area, unlike a conventional method that uses a lithography process or the like. Therefore, the method of the present invention can be more easily used as a method capable of replacing the microstructures produced by a conventional top-down method. In addition, since the surface topology of the formed polymer thin film can be actively controlled, the polymer thin film may be widely used in the display field that requires haptic materials, the VR industry that requires haptic interface technology, and the sensor field that detects changes.

According to the present invention, it is possible to fabricate various functional micropatterned polymer thin films by a simple/cost-effective/rapid process method using an electric field. Various micro-patterns can be used as materials that can secure diversity both optically and mechanically, so they can be widely used in optical devices and patterning fields. In addition, the topography of the fabricated polymer thin films can be actively changed, so that the polymer thin films can be used as haptic materials and sensor materials.

Although the present invention has been described in detail with reference to specific features, it will be apparent to those skilled in the art that this description is only of a preferred embodiment thereof, and does not limit the scope of the present invention. Thus, the substantial scope of the present invention will be defined by the appended claims and equivalents thereto.

The invention claimed is:

1. A method of preparing a shape-reconfigurable micropatterned polymer thin film, the method comprising:
   (a) forming a polymer alignment layer on each of two patterned electrode substrates;
   (b) fabricating a sandwich electrode cell by cross-assembling the two patterned electrode substrates on which the polymer alignment layer is formed at regular intervals;
   (c) injecting a liquid-crystalline organic monomer mixture between the two patterned electrode substrates of the sandwich electrode cell; and
   (d) producing a micropatterned polymer thin film by performing photocuring of the liquid-crystalline organic monomer mixture in a state in which an electric field is applied to the sandwich electrode cell containing the liquid-crystalline organic monomer mixture therein.

2. The method of preparing the shape-reconfigurable micropatterned polymer thin film of claim 1, wherein the two patterned electrode substrates in step (a) is an electrode substrate having a stripe pattern.

3. The method of preparing the shape-reconfigurable micropatterned polymer thin film of claim 1, wherein the patterned electrode substrates on which the polymer alignment layer is formed in step (b), are electrode substrates having stripe patterns at different spacing.

4. The method of preparing the shape-reconfigurable micropatterned polymer thin film of claim 2, wherein each stripe in the stripe pattern has a width of 5 to 20 μm, and a spacing between stripes in the strip pattern is 5 to 40 μm.

5. The method of preparing the shape-reconfigurable micropatterned polymer thin film of claim 1, wherein the sandwich electrode cell has a thickness of 2 to 20 μm.

6. The method of preparing the shape-reconfigurable micropatterned polymer thin film of claim 1, wherein the liquid-crystalline organic monomer mixture contains a liquid-crystalline organic monomer having at least one acrylic group attached thereto and a photoinitiator.

7. The method of preparing the shape-reconfigurable micropatterned polymer thin film of claim 6, wherein the liquid-crystalline organic monomer mixture is at least one selected from the group consisting of 4-(3-acryloyloxypropyloxy)-benzoic acid 2-methyl-1,4-phenylene ester, 4-methoxybenzoic acid 4-(6-acryloyloxy-hexyloxy) phenyl ester, 4-cyanophenyl-4'-(6-acryloyloxyhexyloxy) benzoate, and 1,4-bis-[4-(6-acryloyloxyhexyloxy) benzoyloxy]-2-methylbenzene.

8. The method of preparing the shape-reconfigurable micropatterned polymer thin film of claim 6, wherein the photoinitiator is at least one selected from the group consisting of 2,2-dimethoxy-2-phenylacetophenone, bis(2,4,6-trimethylbenzoyl)-phenylphosphine oxide, bis (n-5-2,4-cylcopentadien-1-yl)-bis(2,6-difluoro-3-(1H-pyrrol-1-yl)-phenyl) titanium, and 2-benzyl-2-dimethylamino-1-(4-morpholinophenyl)-butanone-1.

9. The method of preparing the shape-reconfigurable micropatterned polymer thin film of claim 1, wherein step (d) comprises irradiating UV light at an intensity of 10 to 200 mW for 1 minute to 2 hours.

10. The method of preparing the shape-reconfigurable micropatterned polymer thin film of claim 1, wherein the polymer alignment layer in step (a) is formed by coating the two patterned electrode substrates with a solution of molecular-phobic polyimide, followed by curing.

11. The method of preparing the shape-reconfigurable micropatterned polymer thin film of claim 10, wherein the curing is performed by soft baking at a temperature of 60 to 120° C. and hard baking at a temperature of 150 to 200° C.

12. The method of preparing the shape-reconfigurable micropatterned polymer thin film of claim 1, wherein the liquid-crystalline organic monomer mixture is injected between the two patterned electrode substrates of the sandwich electrode cell at an isotropic phase temperature and then cooled, and the electric field is applied thereto at a nematic liquid crystal-phase temperature.

13. The method of preparing the shape-reconfigurable micropatterned polymer thin film of claim 1, wherein the electric field is an alternating electric field.

14. The method of preparing the shape-reconfigurable micropatterned polymer thin film of claim 1, wherein the electric field is applied at an electric field frequency of 80 kHz to 2 MHz and a voltage of 2 to 200 V.

15. The method of preparing the shape-reconfigurable micropatterned polymer thin film of claim 1, wherein the shape-reconfigurable micropatterned polymer thin film is used as a haptic material or a sensor material.

* * * * *